United States Patent
Bessonov et al.

(10) Patent No.: US 9,887,352 B2
(45) Date of Patent: Feb. 6, 2018

(54) SENSING DEVICE AND METHOD OF PRODUCTION THEREOF

(71) Applicant: Nokia Technologies Oy, Espoo (FI)

(72) Inventors: Alexander Alexandrovich Bessonov, Moscow (RU); Marina Nikolaevna Kirikova, Moscow (RU)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 15/322,034

(22) PCT Filed: Jul. 7, 2014

(86) PCT No.: PCT/RU2014/000499
§ 371 (c)(1),
(2) Date: Dec. 23, 2016

(87) PCT Pub. No.: WO2016/007035
PCT Pub. Date: Jan. 14, 2016

(65) Prior Publication Data
US 2017/0141302 A1    May 18, 2017

(51) Int. Cl.
*H01L 47/00* (2006.01)
*H01L 45/00* (2006.01)
*H01L 27/24* (2006.01)

(52) U.S. Cl.
CPC ......... *H01L 45/1233* (2013.01); *H01L 27/24* (2013.01); *H01L 45/08* (2013.01); *H01L 45/142* (2013.01); *H01L 45/146* (2013.01); *H01L 45/1608* (2013.01); *H01L 45/1641* (2013.01)

(58) Field of Classification Search
CPC ... H01L 45/1233; H01L 45/08; H01L 45/142; H01L 45/146; H01L 45/1641; H01L 27/24
See application file for complete search history.

(56) References Cited

U.S. PATENT DOCUMENTS

| 4,597,162 A | 7/1986 | Johnson et al. |
| 2009/0001336 A1 | 1/2009 | Habib et al. |
| 2010/0027319 A1* | 2/2010 | Noshiro ............. G11C 13/0007 365/148 |
| 2012/0074372 A1* | 3/2012 | Yang ................... H01L 45/1233 257/4 |
| 2014/0014888 A1 | 1/2014 | Lung |
| 2014/0092669 A1 | 4/2014 | Chen et al. |

OTHER PUBLICATIONS

International Search Report and Written Opinion received for corresponding Patent Cooperation Treaty Application No. PCT/RU2014/000499, dated ay 28, 2015, 7 pages.

* cited by examiner

*Primary Examiner* — Yosef Gebreyesus
(74) *Attorney, Agent, or Firm* — Harrington & Smith (57) ABSTRACT

In accordance with an example embodiment of the present invention, a device is disclosed. The device comprises: a sensing region comprising an active material and two or more electrodes in electrical contact with the active material; and a switching region providing control over the sensing region, the switching region comprising an active material and two or more electrodes in electrical contact with the active material. The switching region and the sensing region share one electrode, and the switching region and the sensing region share at least part of the active material. A method and apparatus for producing the device are also disclosed.

14 Claims, 5 Drawing Sheets

SENSING DEVICE AND METHOD OF PRODUCTION THEREOF

RELATED APPLICATION

This application was originally filed as PCT Application No. PCT/RU2014/000499 filed Jul. 7, 2014.

TECHNICAL FIELD

The present application relates to microelectronics. In particular, the present application relates to sensors and variable resistance devices.

BACKGROUND OF THE INVENTION

Structural analogues of monolayer graphene such as transition metal dichalcogenides (TMD) and transition metal oxides (TMO) have attracted a lot of attention in recent years due to their unique electronic and optical properties. Their mechanical flexibility, transparency and compatibility with solution-processable technologies have been of high interest. In addition, these substantially two-dimensional (2D) materials can be highly sensitive to external factors, so various sensors based on 2D materials were suggested including strain sensors, ambient light sensors, humidity sensors, and different gas, chemical and biological sensors.

Realization of addressing logic elements and multiplexers in complex multi-sensor systems such as electronic skin usually relies on an array of field effect transistors (FET) or organic field effect transistors (OFET) which can be situated near the sensors. Fabrication of bulk metal oxide memristors and using them in various configurations with stand-alone sensors and other classical elements of electrical circuits has been disclosed in the art.

SUMMARY

In this section, the main embodiments of the present invention as defined in the claims are described and certain definitions are given.

According to an aspect of the present invention, a device is disclosed. The device comprises: a sensing region comprising an active material and two or more electrodes in electrical contact with the active material; and a switching region providing control over the sensing region, the switching region comprising an active material and two or more electrodes in electrical contact with the active material; wherein the switching region and the sensing region share one electrode, and the switching region and the sensing region share at least part of the active material.

The device may be, for example, a sensing device.

The sensing region can carry out the sensor functions such as react to one or more properties (or changes in the properties) of the environment in which the device is placed. The switching region can function as a switch for the sensing region, providing control over the sensing region. In addition, the switching region may store information regarding one or more previous states of the device.

The active material of the sensing region and the switching region may be substantially the same. Alternatively, the sensing region and the switching region may share only part of the active material.

One of the electrodes of the sensing region coincides with one of the electrodes of the switching region, i.e. the device according to the present invention has three or more electrodes. The electrodes may comprise any suitable conducting material.

According to an embodiment, the elements of the switching region are arranged to form a vertical stack. By vertical stack is meant a structure which comprises a bottom electrode, an active material positioned on top of the bottom electrode, and a top electrode positioned on top of the active material. In an embodiment, the switching region having a vertical stack structure shares the bottom electrode with the sensing region.

According to an embodiment, the elements of the switching region form a memristor.

The memristor is an electrical resistance switch with the capability to retain a state of resistance based on the history of applied voltage and passed charge. Memristor devices are capable of storing and processing information in contrast to conventional integrated circuit technology where switching transistors and memory are separated. According to an embodiment, the memristor may be a two-terminal vertical-stack, two-terminal planar or three-terminal resistance switch. The memristor may include chemical and/or physical switching mechanisms.

According to an embodiment of the present invention, the abovementioned memristor is a bipolar, unipolar or irreversible memristor.

According to an embodiment, the sensing region has a planar structure and two or more electrodes of the sensing region are separated horizontally. This structure may be realized, for example, by depositing two or more electrodes on the same substrate but spaced from each other, and then depositing the active material to fill the gaps between the electrodes and to cover them.

According to an embodiment, the active material of the switching region and/or the active material of the sensing region comprises one or more materials selected from the group of: transition metal dichalcogenides (TMD), partially oxidized TMD, fully oxidized transition metal oxides (TMO) and graphene-like materials.

The TMD materials may be selected from the group of materials with the following chemical formulas: $WX_2$, $MoX_2$, $ScX_2$, $TiX_2$, $HfX_2$, $ZrX_2$, $VX_2$, $CrX_2$, $MnX_2$, $FeX_2$, $CoX_2$, $NiX_2$, $NbX_2$, $TcX_2$, $ReX_2$, $PdX_2$ and $PtX_2$ wherein "X" may be S, Se or Te. The TMO materials may be selected from the group of materials with the following chemical formulas: $WO_n$, $MoO_n$, $ScO_n$, $TiO_n$, $HfO_n$, $ZrO_n$, $VO_n$, $CrO_n$, $MnO_n$, $FeO_n$, $CoO_n$, $NiO_n$, $NbO_n$, wherein "n" has a value of 2 or 3. The graphene-like materials may be selected from the group including graphene oxide and materials with the following chemical formulas: hexagonal BN, AlN, GaN, InN, InP, InAs, BP, BAs, GaP. All of the above materials may be provided as combinations of few-layer flakes or other few-layer structures. As a result, the active material of any region may comprise one or more few-layer materials selected from the groups listed above. For the purposes of this specification, the term "few-layer" refers to a layered structure with 1-10 layers of atoms.

It is clear to a skilled person that the active material can comprise these materials in any combination, e.g. in homogenous composites or as separate hybrid layers.

As mentioned earlier, the active material of the switching region and of the sensing region may be substantially the same active material, for example the same layer of active material. Alternatively, only part of these materials may be shared.

According to an embodiment, part of the active material of the switching region that is in proximity to at least one of the electrodes of the switching region is fully oxidized, and the remaining active material of the switching region is partially oxidized or unoxidized.

Part of the active material in proximity to an electrode can refer to the part of the active material that is closer than 100 nm to the electrode.

According to an embodiment, the active material of any one of the regions has a thickness in the range of 10 to 1000 nanometers. The device may have a thickness in the range of 10 nanometers to 20 micrometers.

According to an embodiment, the elements of the sensing region form a sensor selected from the group of: temperature sensor, pressure sensor, touch sensor, strain sensor, mechanical deformation sensor, magnetic field sensor, ambient light sensor, UV light sensor, ionizing radiation detector, humidity sensor, gas sensor, chemical sensor and biological sensor.

According to embodiments of the present invention, the sensor can be a capacitive sensor or a resistive sensor.

According to an embodiment, at least one electrode of the sensing region and at least one electrode of the switching region are connected to a common electrical circuit.

According to embodiments, the sensing region can be electrically connected to the switching region in series or in parallel.

According to an embodiment, all of the electrodes comprise at least one conductive material from the group of: metals, metal oxides, carbon-based materials, organic materials and polymer materials. The electrodes may comprise metals selected from the group of: silver, gold, copper, aluminum, nickel and cobalt.

According to an aspect of the present invention, a method is disclosed. The method comprises: depositing two or more bottom electrodes; depositing an active material over the two or more bottom electrodes; partially or fully oxidizing part of the active material; and depositing at least one top electrode on the partially or fully oxidized part of the active material.

The method may be, but not limited to, a method for producing or fabricating a sensing device, or a method for producing or fabricating a sensor combined with a memristor.

In an embodiment, the method further comprises providing a substrate, wherein the two or more bottom electrodes are deposited on the substrate. The substrate can be either rigid or flexible and can comprise glass, metal foils, plastic foils, silicones, and rubbers.

As it is clear to a skilled person, the bottom and top electrodes are named accordingly only for clarity purposes. The method is not limited to the described order of deposition and oxidation of the materials.

According to an embodiment, the bottom and top electrodes are deposited by at least one of the following deposition techniques: printing, sputtering, photolithography, chemical vapor deposition, atomic layer deposition and physical vapor deposition. Printing of the electrodes may include, for example, spin-coating, slot die-coating, spray coating, soft lithography, transfer printing, laser patterning, dispensing, screen printing, offset printing, gravure printing, flexography, aerosol jet printing, inkjet printing and thin film transfer.

According to an embodiment, the active material is deposited over the two or more bottom electrodes either by vacuum techniques such as chemical vapor deposition, atomic layer deposition and physical vapor deposition or from a nanoflake solution by at least one of the following deposition techniques: spin-coating, slot die-coating, spray coating, spreading technique, lifting technique, thin film transfer, soft lithography, drop-casting, dispensing, aerosol jet printing, and inkjet printing. According to an embodiment, the active material may be a transition metal dichalcogenides (TMD), a partially oxidized TMD, a transition metal oxide (TMO) or a graphene-like material.

According to an embodiment, partially or fully oxidizing a part of the active material comprises treating a part of the active material in an environment comprising oxygen or ozone by at least one of the following techniques: local convection heating, infrared (IR) heating, laser, plasma, and xenon flash lamp treatment. If the active material is an oxide or a partially oxidized material, a part of the active material is then further oxidized to a higher valence state.

According to an embodiment, treating a part of the active material by local convection heating is performed at a temperature in the range of 150 to 200 degrees Celsius.

As it is clear to a skilled person, the methods according to these embodiments are not limited to the mentioned techniques, and they are indicated for exemplary purposes only.

According to a third aspect of the present invention, an apparatus is disclosed. The apparatus comprises: at least one processor; at least one memory coupled to the at least one processor, the at least one memory comprising program code instructions which, when executed by the at least one processor, cause the apparatus to perform the methods according to any of the abovementioned embodiments.

According to a fourth aspect of the present invention, an apparatus is disclosed. The apparatus comprises: means for depositing two or more bottom electrodes; means for depositing an active material over the two or more bottom electrodes; means for partially or fully oxidizing part of the active material; and means for depositing at least one top electrode on the partially or fully oxidized part of the active material.

BRIEF DESCRIPTION OF THE DRAWINGS

For a more complete understanding of example embodiments of the present invention, reference is now made to the following descriptions taken in connection with the accompanying drawings in which.

DETAILED DESCRIPTION OF THE EMBODIMENTS

Exemplary embodiments of the present invention and its potential advantages are understood by referring to FIGS. 1 through 4 of the drawings.

The present invention relates to a sensing apparatus and its manufacturing method based on solution-processing of two-dimensional (2D) materials. The sensor is combined with a memristor which may act as an on-off switch and provide sensor memory functions at the same time. The invention may be used in form factors compatible with transparent, flexible and stretchable electronics, adaptive electronics, neuromorphic systems, bio-inspired electronics, advanced electronic skin (e-skin) and electronic nose (e-nose) devices.

Figure 1:
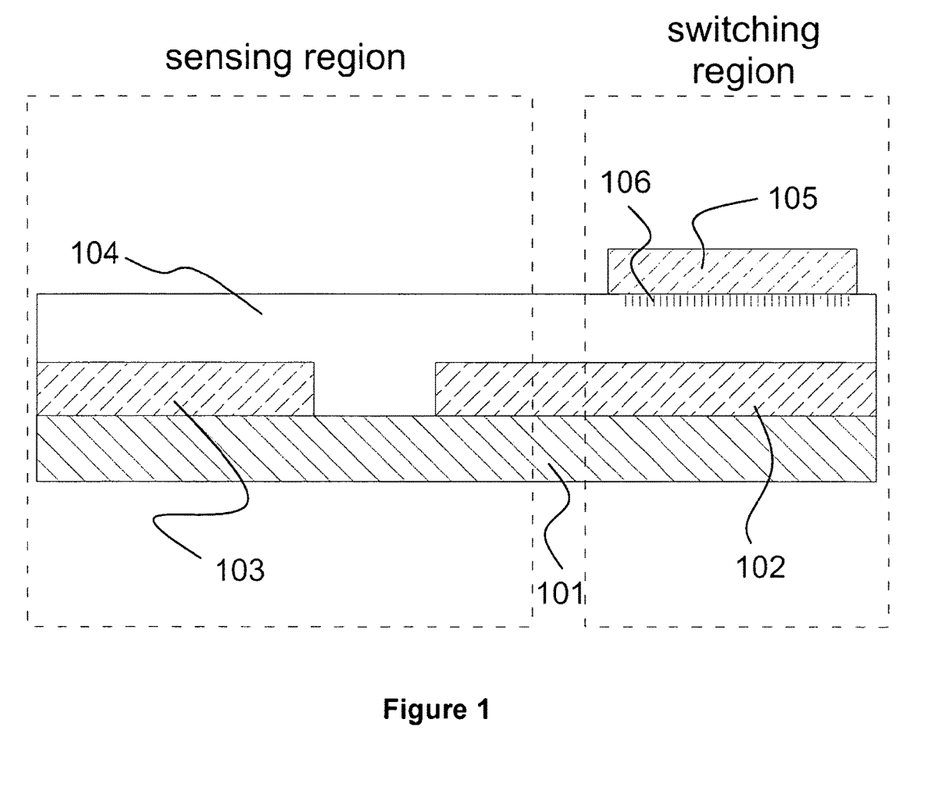
FIG. 1 shows a device according to an embodiment of the present invention.

FIG. 1 shows a device according to an embodiment of the present invention. It is clear to a skilled person that the device shown in this figure is an exemplary implementation of the present invention, and the claimed device is not limited to the structure shown herein. The device may be a sensing device. In the exemplary embodiment, the device can comprise a substrate 101 which can be made of any appropriate material such as glass, metal, polymer, silicone, rubber or other composite materials.

The device further comprises a first electrode 102 and a second electrode 103. The electrodes can comprise a conductive material, for example a metal. The first and second electrodes 102, 103 may be planar electrodes, wires or any other appropriate type of electrodes. In this embodiment, the first electrode 102 and the second electrode 103 may be referred to as "bottom electrodes" for clarity purposes only, and without limitations.

The device comprises two regions, a sensing region and a switching region, as shown on FIG. 1. In this implementation, the first electrode 102 is shared by the switching region and the sensing region, while the second electrode 103 is an electrode of the sensing region only. The device further comprises active material 104 in electrical contact with the bottom electrodes 102, 103. The active material can comprise, for example, materials such as transition metal dichalcogenides (TMD), transition metal oxides (TMO), TMD-TMO composites (mixtures of sulfides and oxides, sulfoxides, selenoxides, telluroxides, etc.) and other graphene-like materials. These materials may be few-layer materials. The active material 104 may be a common layer of material shared by the sensing and switching regions, as shown on FIG. 1, or it may be shared only in part. On FIG. 1, parts of the active material 104 may belong only to the switching region or the sensing region, for example the part that separates the bottom electrodes 102, 103 from each other and fills the space between them.

The device also comprises a third electrode 105, which can be positioned on top of the active material 104 according to an exemplary embodiment shown on FIG. 1. The third electrode 105 may be called the "top" electrode for clarity purposes only, and without limitation. The top electrode 105 is in electrical contact with the active material 104. In this implementation, the third electrode 105 is an electrode of the switching region only. According to an embodiment, part 106 of the active material 104 that is in proximity to one of the electrodes (in this case the top electrode 105) can be fully or partially oxidized. The oxidized active material 106 of the switching region provides the effect of improved memristive properties of said region.

The sensing region can carry out the sensor functions such as react to one or more properties (or changes in the properties) of the environment in which the device is placed. Such functions may include functionality of a temperature sensor, pressure sensor, touch sensor, strain sensor, mechanical deformation sensor, magnetic field sensor, ambient light sensor, UV light sensor, ionizing radiation detector, humidity sensor, gas sensor, chemical sensor and biological sensor. The sensor can be of a resistive or a capacitive type.

Elements of the switching region can form a memristor. In an embodiment, the elements can form a vertical-stack memristor. The switching region can function as a switch for the sensing region, providing control over the sensing region. In addition, the switching region may store information regarding one or more previous states of the device. In FIG. 1, elements of the switching region form a memristor which can be a bipolar, unipolar or irreversible memristor. The switching functionality of the device may be governed by bipolar memristive behavior of the device with the ability to control resistance in a wide range by applying a train of electric pulses, while the memory functionality can be provided by e.g. TMO material "sandwiched" between the first 102 and third 105 electrodes. Typically, the TMD layer is relatively conductive with ohmic interfaces supported by the low-dimensional nature, and a large fraction of applied voltage drops on the resistive TMO layer and/or TMO-top electrode interface that blocks the current. The bipolar resistance switching property may rely on an intrinsic Schottky junction with mixed ion electron conduction. In this case, the range of possible resistance states can be effectively adjusted by tuning a Schottky barrier at the metal-oxide interface. Due to the asymmetric structure the device may show a diode-like current rectifying property.

An effect of the above embodiments is that the device can comprise a memory for storing information such as the previous state of the device. This memory can be a non-volatile memory. One of the effects of combining sensor and memristor functionality is reliable multi-state resistance switching of the device. A particular effect of using memristors for switches in sensing devices is their low resistance (a few Ohms) in the ON state. This provides the possibility to use any sensing materials with a broad range of resistances from Ohms to MOhms. Memristors also show a large on/off ratio which can be effectively utilized for non-volatile memory with low power consumption. Different resistances enable multiple information units to be stored in a single cell. Because of low operating voltages within 0.5 V and small switching currents in sub-$\mu$A current level, less energy is used which makes these devices suitable for energy-constrained applications.

According to an embodiment, the top electrode 105 and at least one bottom electrode may be connected to the same electrical circuit. The sensing region and the switching region may be configured as series circuits or parallel circuits. Combining a sensor and a memristors in a single device leads to fewer manufacturing steps and reduced complexity of the circuit, while different configuration options provide flexibility in choosing the operation regime.

It is clear to a skilled person that the device is not limited to three electrodes as shown on FIG. 1, as long as one of the electrodes and at least a part of the active material is shared by the switching and sensing regions, providing the effect of a simple combined device with multiple functions. According to an embodiment, an array or stack of devices according to the present invention is produced.

Figure 2:
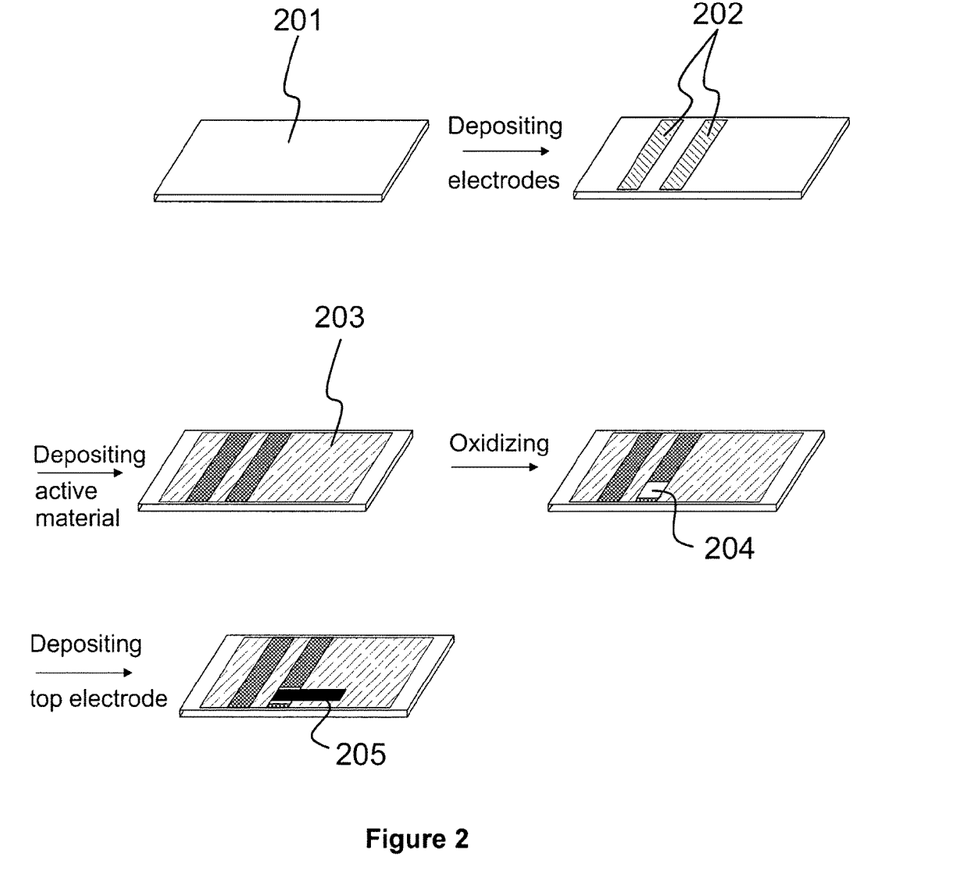
FIG. 2 shows a method according to an embodiment the present invention.

FIG. 2 shows a method according to an embodiment of the present invention. This method is suitable for production or fabrication of sensing devices such as the device shown on FIG. 1. According to the method, a substrate 201 can be provided. Bottom electrodes 202 are then deposited onto the substrate. In an exemplary embodiment, the bottom electrodes 202 are silver electrodes and can be printed and subsequently sintered on a Polyethylene Naphthalate (PEN) substrate using a silver nanoparticle ink. For simplicity, they are shown as rectangle electrodes. However, the electrodes may have any shape according to the present invention.

An active material 203 is deposited over the bottom electrodes 202. The active material may be deposited from a nanoflake solution. The active material may be a transition metal dichalcogenide (TMD), a partially oxidized TMD, a transition metal oxide (TMO) or a graphene-like material. Deposition techniques include for example spin-coating, slot die-coating, spray coating, spreading technique, lifting technique, thin film transfer, soft lithography, drop-casting, dispensing, aerosol jet printing, and inkjet printing. Thickness of the active material layer may vary from 10 nanometers to 1 micrometer. At least one part of the active material 203 is partially or fully oxidized next. In an embodiment, a part of the material over the bottom electrode oxidized by one of the techniques: local convection heating with temperature up to 150-400° C., IR heating, laser treatment, Xenon flash lamp irradiation, ozonetreatment or oxygen plasma treatment. This results in an oxidized area 204 of the active material 203. The thickness of the oxidized part 204 depends on the oxidation degree which is governed by the energy delivered to the system during oxidation. This thickness may vary from 1 to 100 nanometers. Finally, a top electrode 205 is deposited on the oxidized area 204 of the active material 202. For example, the top electrode 205 can be a silver electrode printed over the oxidized area 204. In the exemplary embodiment of FIG. 2, the resulting structure forms a vertical-stack cross-point memristor below the top electrode 205.

In one example embodiment, a resistive $MoS_2$ sensor combined with a layered $MoO_x/MoS_2$ memristive device has been fabricated. The fabrication method is an example of the embodiment of FIG. 2. The bottom electrodes comprised of silver nanoparticle ink were printed by inkjet printing on a PEN substrate. The $MoS_2$ film was deposited via spreading technique which is a Langmuir-Blodgett thin film transfer technique. The film was dried in vacuum at 80° C. and then locally oxidized by point heating at 200° C. for 1 hour. As a result, the sensor area remained as deposited while the memristor area experienced thermal oxidation at the top surface due to the presence of oxygen in ambient air. Finally, a silver top electrode was deposited by screen printing using silver nanoparticle ink and sintered at 130° C. for 30 min. According to Atomic force microscope (AFM) and Scanning electron microscope (SEM) analysis the thickness of $MoS_2$ film was from approximately 20 to 600 nm depending on the number of deposited layers. X-ray photoelectron spectroscopy (XPS) depth profile of the sample oxidized at 200° C. for 3 hours revealed less than approximately 3 nm of $MoO_r$ thickness over approximately 300 nm of $MoS_2$ film.

Figure 3:
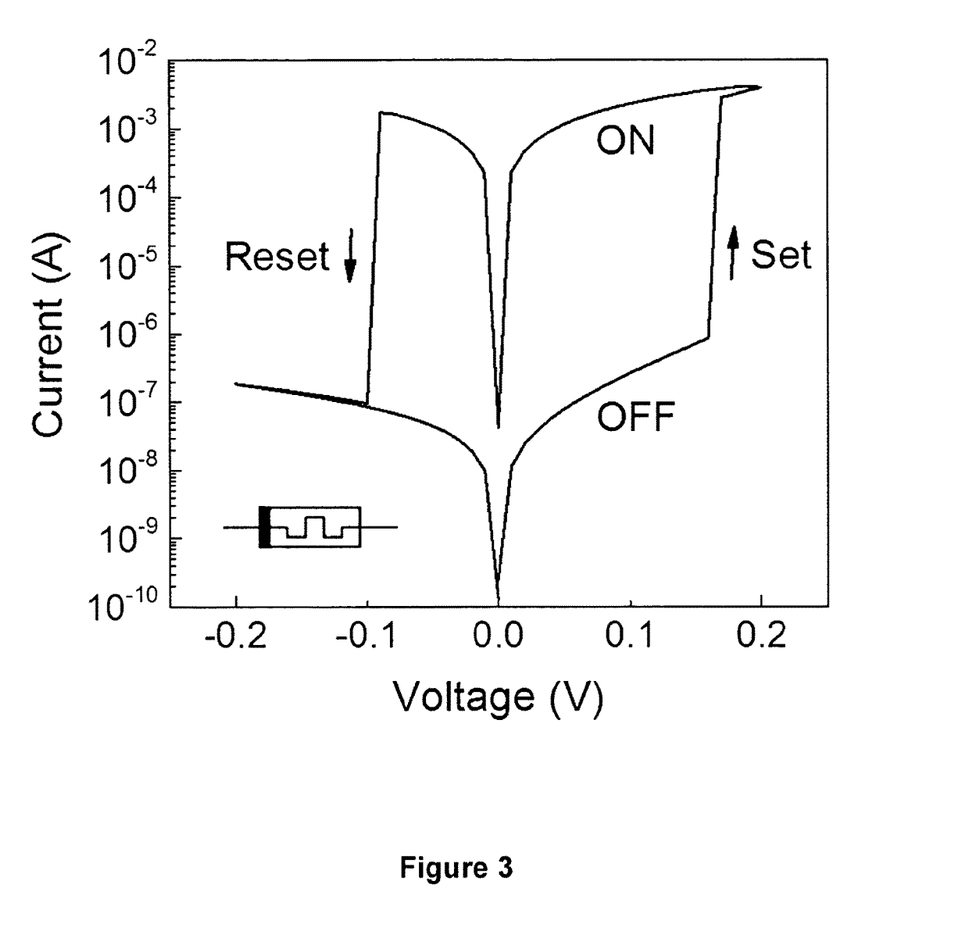
FIG. 3 is a current-voltage graph of a layered $MoO_x/MoS_2$ memristor according to an embodiment.
Figure 4A:
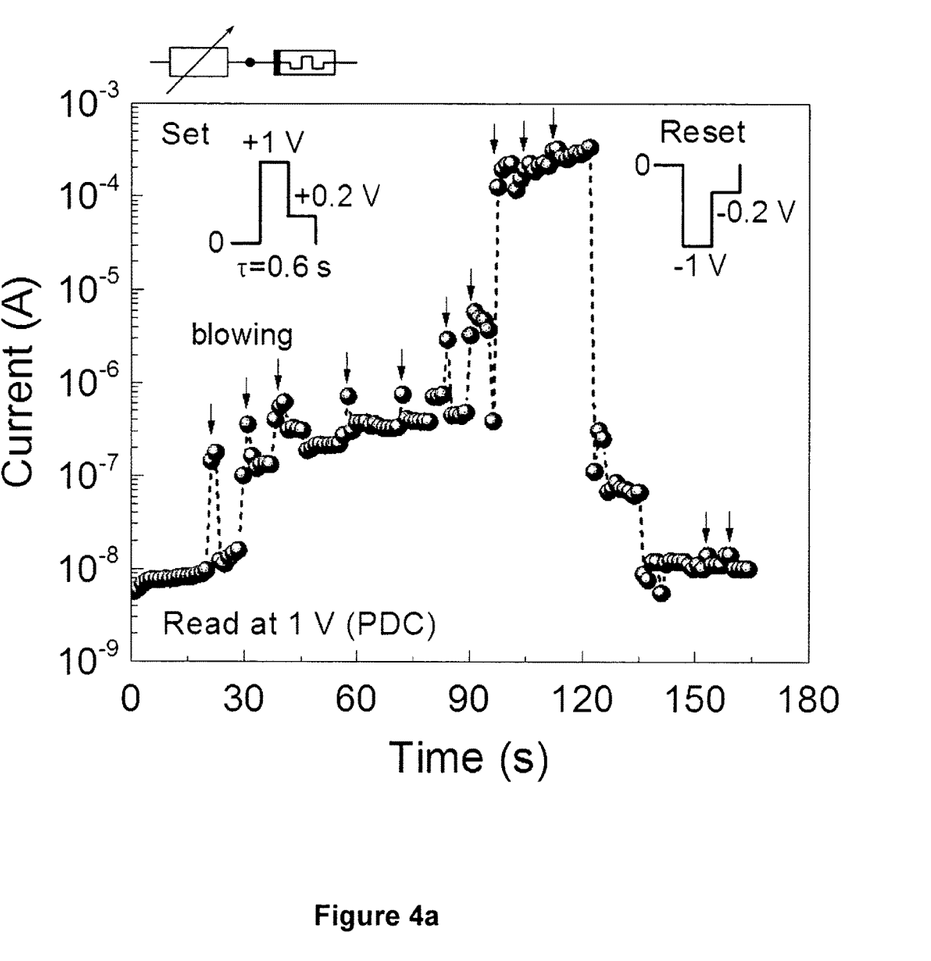
FIGS. 4*a* and 4*b* show long-term modulation of a sensor-memristor device response, measured by applying sequences of pulses.
Figure 4B:
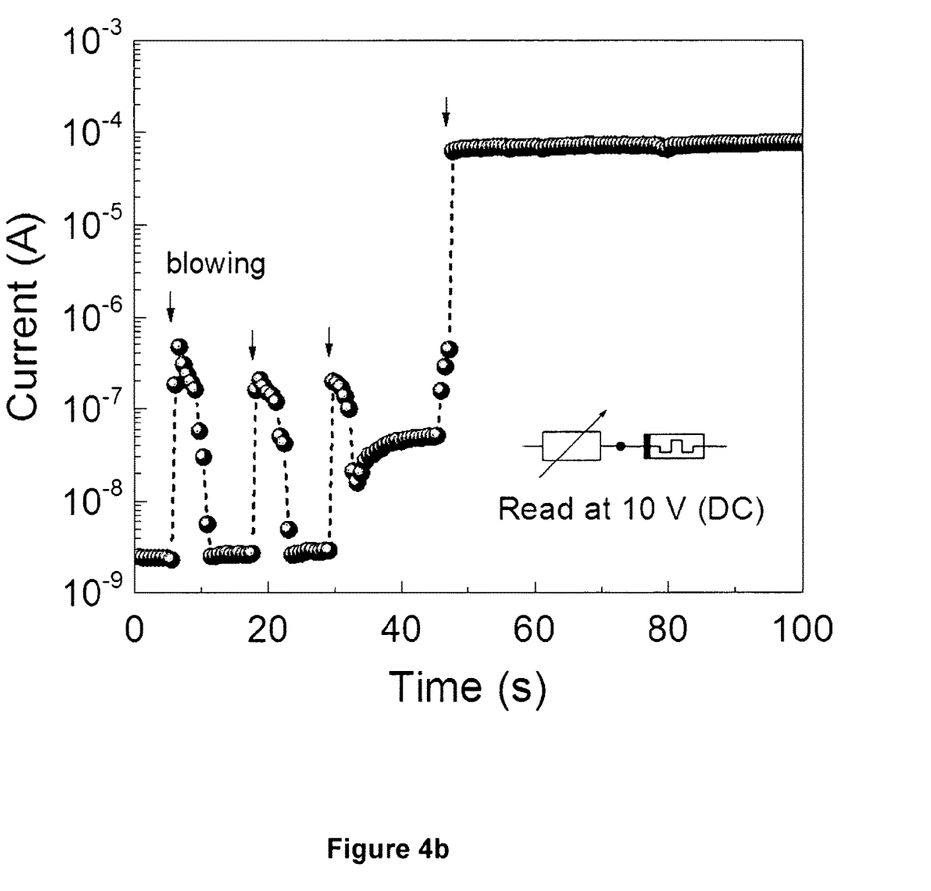

The resulting layered $MoO_x/MoS_2$ memristor, when measured separately, demonstrated an I-V hysteresis loop shown on FIG. 3. Due to strong nonlinearity in switching dynamics, different schemes of synaptic plasticity can be implemented by applying a sequence of electric pulses (by analogy with a biological synapse). A reliable resistance switching of the memristor exceeding five orders of magnitude has been observed. The initial state is in the high-resistance state, and application of a positive voltage ("set") caused a shift to the low-resistance state at approximately 100-200 mV. Negative voltage ("reset") then switched the device back to the high-resistance state.

According to an example embodiment of FIG. 1, a device comprising a sensor and a memristor was fabricated. To demonstrate a modulation of the sensor's signal by the memristor a humidity response of $MoS_2$ resistive sensor was measured. Due to the local humidity rise up to 55-60%, the electric current rapidly increases at the surface of $MoS_2$ film. The humidity change was achieved by blowing in order to simplify the system. The humidity sensor combined with the memristor changes its resistance under blowing gradually in contrast to the resistance change of a separated sensor. The change is shown on FIG. 4a. This provides an analog memory function of the sensor with multi state operation. In other words, the sensor's response depends on the history of stimulus and electric current passed through the device. An observed resistance change of more than 5 orders of magnitude during sensor operation allows realizing switching between ON and OFF states. Since a bipolar memristor was used in the example, it could be returned from the low resistance state to the initial high resistance state by a sequence of depression pulses with negative bias. The sensor-memristor module then gradually switches the current during blowing for both the direct current (DC) and pulsed direct current (PDC), as shown on FIG. 4b.

An apparatus in accordance with the invention may include at least one processor in communication with a memory or memories. The processor may store, control, add and/or read information from the memory. The memory may comprise one or more computer programs which can be executed by the processor. The processor may also control the functioning of the apparatus. The processor may control other elements of the apparatus by effecting control signaling. The processor may, for example, be embodied as various means including circuitry, at least one processing core, one or more microprocessors with accompanying digital signal processor(s), one or more processor(s) without an accompanying digital signal processor, one or more coprocessors, one or more multi-core processors, one or more controllers, processing circuitry, one or more computers, various other processing elements including integrated circuits such as, for example, an application specific integrated circuit (ASIC), or field programmable gate array (FPGA), or some combination thereof. Signals sent and received by the processor may include any number of different wireline or wireless networking techniques.

The memory can include, for example, volatile memory, non-volatile memory, and/or the like. For example, volatile memory may include Random Access Memory (RAM), including dynamic and/or static RAM, on-chip or off-chip cache memory, and/or the like. Non-volatile memory, which may be embedded and/or removable, may include, for example, read-only memory, flash memory, magnetic storage devices, for example, hard disks, floppy disk drives, magnetic tape, etc., optical disc drives and/or media, non-volatile random access memory (NVRAM), and/or the like. If desired, the different functions discussed herein may be performed in a different order and/or concurrently with each other. Furthermore, if desired, one or more of the above-described functions may be optional or may be combined.

The abovementioned embodiments provide the technical effect of a simple manufacturing process, which is easy to scale up, and the process can be coupled to mass production. The process is also compatible with low-melting-point plastic substrates, flexible substrates and Roll to Roll manufacturing. The resulting device has a reduced complexity due to two-terminal switch and a combined sensor and memristor, and the active material can be well below 100 nm allowing high transparency. A wide range of suitable active materials allows for tunable functional characteristics of final devices.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

What is claimed is:

1. A device, comprising:

a sensing region comprising an active material and two or more electrodes in electrical contact with the active material; and a switching region providing control over the sensing region, the switching region comprising an active material and two or more electrodes in electrical contact with the active material; wherein the switching region and the sensing region share one electrode, and the switching region and the sensing region share at least part of the active material.

2. The device of claim 1, wherein elements of the switching region are arranged to form a vertical stack.

3. The device of claim 1, wherein elements of the switching region form a memristor.

4. The device of claim 3, wherein the memristor is a bipolar memristor, a unipolar memristor or an irreversible memristor.

5. The device of claim 1, wherein the sensing region has a planar structure and the two or more electrodes of the sensing region are separated horizontally.

6. The device of claim 1, wherein the active material of the switching region and/or the active material of the sensing region comprises one or more materials selected from the group of: transition metal dichalcogenides (TMD), partially oxidized TMD, fully oxidized transition metal oxides (TMO) and graphene-like materials.

7. The device of claim 1,
wherein part of the active material of the switching region that is in proximity to at least one of the two or more electrodes of the switching region is fully oxidized, and
wherein the remaining active material of the switching region is partially oxidized or unoxidized; and
wherein the active material of the switching region and/or the active material of the sensing region has a thickness in the range of 10 to 1000 nanometers.

8. The device of claim 1, wherein the elements of the sensing region form a sensor selected from the group of: temperature sensor, pressure sensor, touch sensor, strain sensor, mechanical deformation sensor, magnetic field sensor, ambient light sensor, UV light sensor, ionizing radiation detector, humidity sensor, gas sensor, chemical sensor and biological sensor.

9. The device of claim 8, wherein the sensor is a capacitive sensor.

10. The device of claim 8, wherein the sensor is a resistive sensor.

11. The device of claim 1, wherein at least one electrode of the sensing region and at least one electrode of the switching region are connected to a common electrical circuit.

12. The device of claim 11, wherein the sensing region is electrically connected to the switching region in series.

13. The device of claim 11, wherein the sensing region is electrically connected to the switching region in parallel.

14. The device of claim 1, wherein all electrodes comprise at least one conductive material from the group of: metals, metal oxides, carbon-based materials, organic materials and polymer materials.

* * * * *